United States Patent [19]
Cherng

[11] Patent Number: 5,874,336
[45] Date of Patent: Feb. 23, 1999

[54] METHOD TO IMPROVE YIELD FOR CAPACITORS FORMED USING ETCHBACK OF POLYSILICON HEMISPHERICAL GRAINS

[75] Inventor: George Meng-Jaw Cherng, Hsinchu, Taiwan

[73] Assignee: Vanguard International Semiconductor Manufacturing, Hsin-Chu, Taiwan

[21] Appl. No.: 880,953

[22] Filed: Jun. 23, 1997

[51] Int. Cl.⁶ .................................. H01L 21/8242
[52] U.S. Cl. .............................. 438/255; 438/398
[58] Field of Search .................... 438/238–239, 438/253–255, 381, 396–398; 257/306, 309

[56] References Cited

U.S. PATENT DOCUMENTS

| | | | |
|---|---|---|---|
| 5,082,797 | 1/1992 | Chan et al. | 437/52 |
| 5,134,086 | 7/1992 | Ahn | 437/52 |
| 5,254,503 | 10/1993 | Kenney | 437/228 |
| 5,256,587 | 10/1993 | Jun et al. | 437/52 |
| 5,358,888 | 10/1994 | Ahn et al. | 437/52 |
| 5,447,878 | 9/1995 | Park et al. | 437/52 |
| 5,492,848 | 2/1996 | Lur et al. | 437/52 |
| 5,622,889 | 4/1997 | Yoo et al. | 438/397 |

OTHER PUBLICATIONS

"A Capacitor–Over–Bit–Lhe (COB) Cell with a Hemispherical Grain Storage Node for 64 MbDRAMS" by Sakao et al, IEDM, 1990, pp. 27.31–27.34.

*Primary Examiner*—Joni Chang
*Attorney, Agent, or Firm*—George O. Saile; Stephen B. Ackerman; Larry J. Prescott

[57] ABSTRACT

A method is described for forming capacitor plates with extended surface area using polysilicon hemispherical grains or HSG polysilicon. The HSG polysilicon is formed on the top surface and sidewalls of first capacitor plates. A vertical anisotropic etching step forms an irregular top surface of the first capacitor plates and an anneal step provides good adhesion between the grains of HSG polysilicon and the sidewalls of the first capacitor plates. A timed etchback of the dielectric between the first capacitor plates insures good electrical insulation between adjacent first capacitor plates.

20 Claims, 6 Drawing Sheets

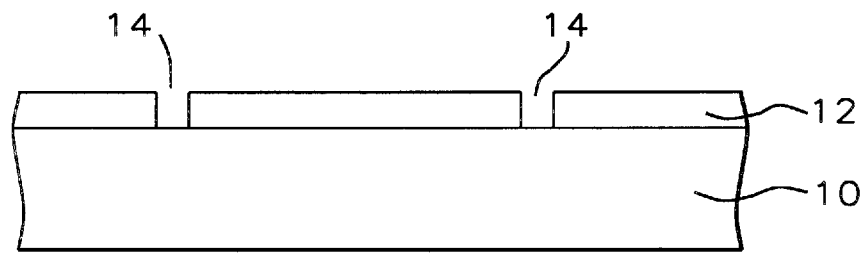
FIG. 1 — Prior Art
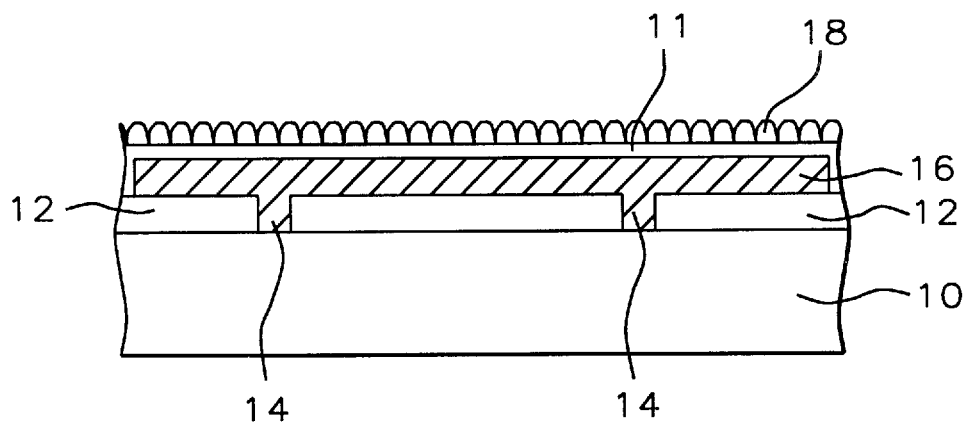
FIG. 2A — Prior Art

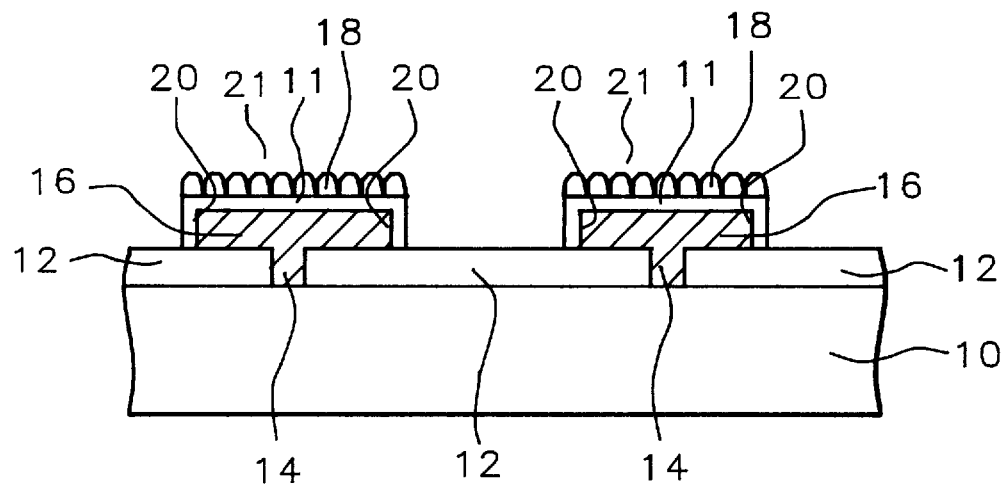
FIG. 2B – Prior Art
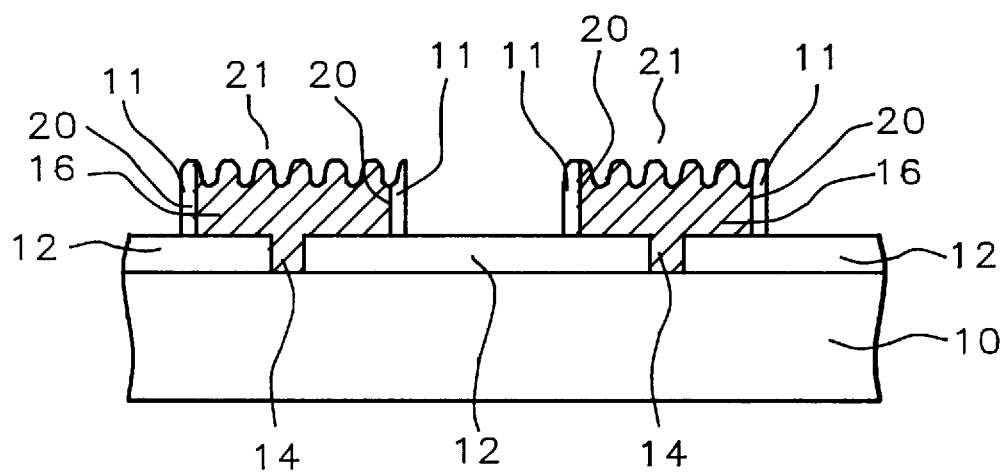
FIG. 2C – Prior Art

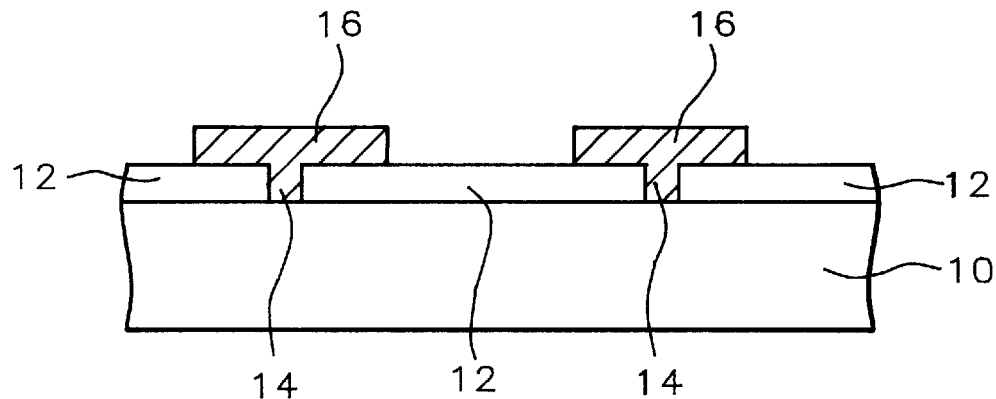
FIG. 3A — Prior Art
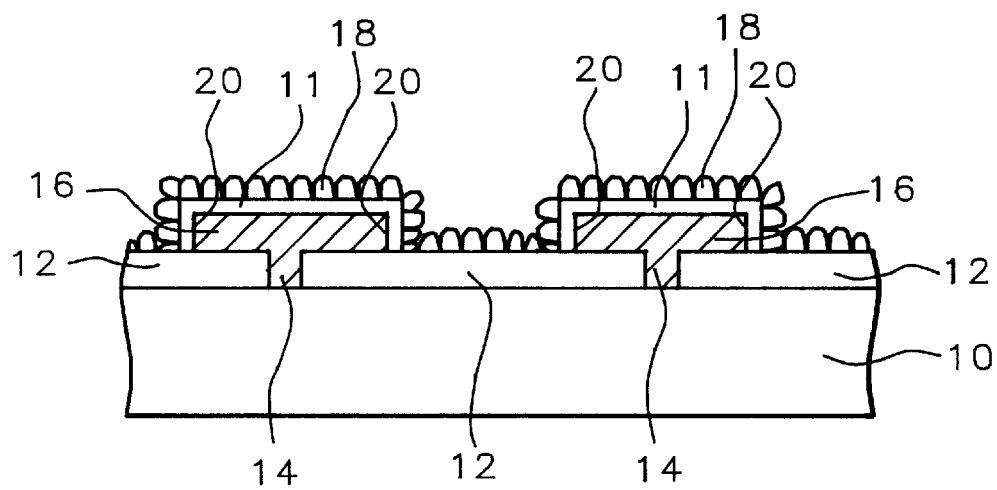
FIG. 3B — Prior Art

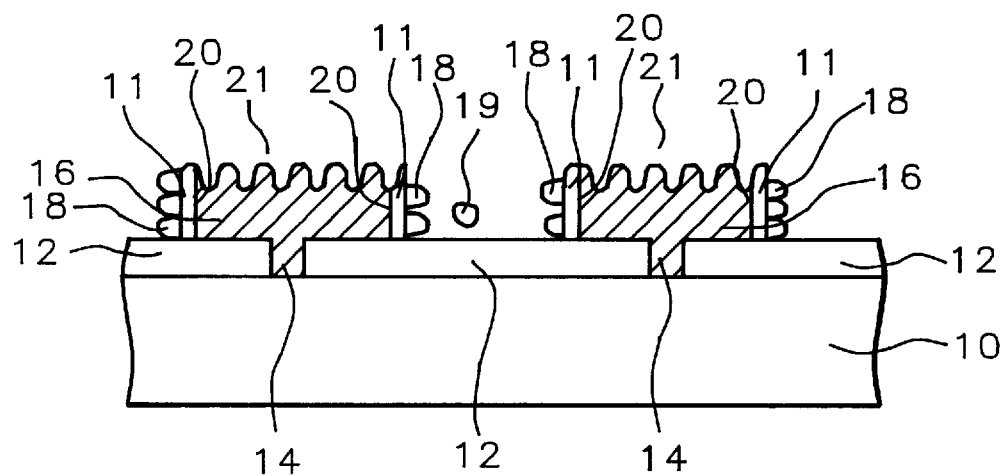
FIG. 3C – Prior Art
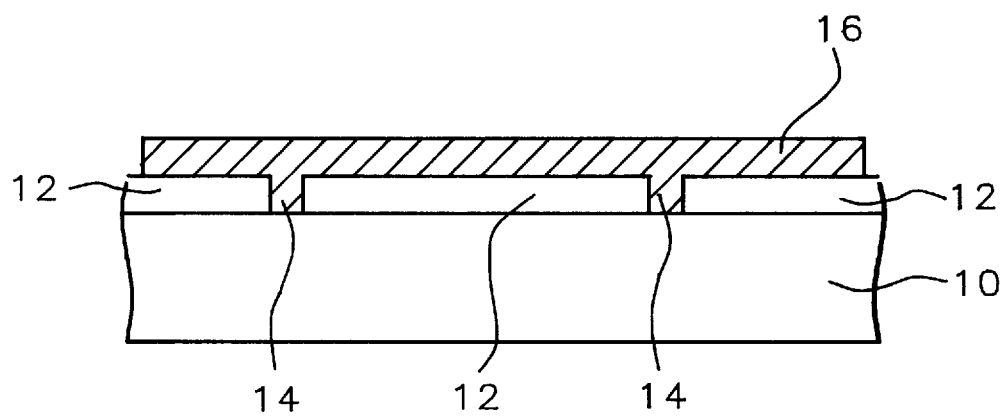
FIG. 4

METHOD TO IMPROVE YIELD FOR CAPACITORS FORMED USING ETCHBACK OF POLYSILICON HEMISPHERICAL GRAINS

BACKGROUND OF THE INVENTION (1) Field of the Invention

This invention relates to the formation of high capacitance capacitors on integrated circuit wafers and more particularly to capacitor plates using etchback of polysilicon hemispherical grains.

(2) Description of the Related Art

Polysilicon hemispherical grains, HSG polysilicon, are used to increase surface area of capacitor plates used to form integrated circuit capacitors, particularly for DRAM circuits. The HSG polysilicon is formed on a conductor, usually polysilicon, used to form capacitor plates. Etchback of the HSG polysilicon using vertical anisotropic etching forms an irregular top surface of the capacitor plates. HSG polysilicon is also used on the sidewalls of the capacitor plates however adhesion of the HSG polysilicon to the sidewalls can be a problem.

U.S. Pat. No. 5,256,587 to Jun et al. describes methods of forming capacitor plates using a hemisphere particle layer having hills and valleys on a layer to be etched. The hemispherical particle layer is used on the top surface of the capacitor plates.

U.S. Pat. No. 5,254,503 to Kenny describes the use of sub-lithographic relief images to increase the surface area of the top surface of capacitor plates. Polysilicon and porous silicon can be used to form the sub-micron relief pattern.

U.S. Pat. No. 5,082,797 to Chan et al. describes the use of a texturized polysilicon structure to increase the area of capacitor plates. A polysilicon structure is subjected to a wet oxidation followed by a wet oxide etch to form the texturized polysilicon structure.

U.S. Pat. No. 5,447,878 to Park et al. describes the use of an HSG polysilicon layer of form extended surface area on both the top and the sidewalls of capacitor plates, however an anneal step after the formation of the HSG polysilicon layer and an timed oxide back etch is not described.

U.S. Pat. No. 5,492,848 to Lur et al. describes the use of silicon nodules formed on the top surface of capacitor plates to increase surface area.

U.S. Pat. No. 5,134,086 to Ahn describes exposing a first polysilicon layer, an oxide layer, and a second polysilicon layer consisting of grains to an oxide etchant. The oxide etchant penetrates the grain boundaries of the second polysilicon layer and etches the oxide layer at the grain boundaries. The etching forms an irregular surface which increases surface area. The irregular surface area is on the top surface of the capacitor plates.

U.S. Pat. No. 5,358,888 to Ahn et al. describes the use of polysilicon hemispherical grains to form an irregular surface on the top surface of capacitor plates.

A paper entitled "A CAPACITOR-OVER-BIT-LINE (COB) CELL WITH A HEMISPHERICAL-GRAIN STORAGE NODE FOR 64 Mb DRAMs", by Sakao et al., IEDM, 1990, pages 27.3.1–27.3.4 describes using etchback of HSG polysilicon to increase the surface area of capacitor plates. The use of an anneal step or a timed oxide etchback step is not described.

This invention describes the use of HSG polysilicon along with an anneal step and a timed oxide etchback step to form an irregular surface on the top and sidewalls of capacitor plates thereby increasing surface area and capacitance. The method of this invention prevents individual grains from breaking away thereby resulting in improved chip yield.

SUMMARY OF THE INVENTION

Capacitors are an important element in integrated circuit technology, particularly for DRAM technology. Capacitors, by the nature of their operation, consume valuable integrated circuit element space. As levels of integration increase the problem of space for capacitors with sufficient capacitance also increases, particularly for DRAMs. Frequently methods are employed which form irregularly shaped capacitor plates, thereby increasing the surface area of the capacitor plates, and thereby the capacitance of the capacitor, without increasing the amount of integrated circuit space required for the capacitor.

One of the methods used to increase the surface area of capacitor plates employs the use of polysilicon hemispherical grains, HSG polysilicon. FIGS. 1 and 2A–2C shows one method of increasing the surface area of capacitor plates. FIG. 1 shows a cross section view of an integrated circuit wafer 10 with a layer of first dielectric 12, such as an oxide, having contact holes 14 formed thereon. FIG. 2A shows a cross section view of the integrated circuit wafer 10 with a layer of polysilicon 16 formed thereon. The polysilicon 16 also fills the contact holes 14 in the layer of first dielectric 12. A layer of HSG polysilicon 18 is formed over the layer of polysilicon 16. Polysilicon hemispherical grains are formed using low pressure chemical vapor deposition, LPCVD, of polysilicon at temperatures in the range of 500° to 600° C. Under these conditions the polysilicon deposits as hemispherical grains rather than a smooth film. In the process of depositing the HSG polysilicon a thin film of native oxide 11 also forms between the polysilicon layer 16 and the layer of HSG polysilicon 18.

As shown in FIG. 2B the layers of polysilicon 16 and HSG polysilicon 18 are patterned to form a number of first capacitor plates having a top surface 21 and sidewalls 20. The top surface 21 of the first capacitor plates has a number of hills and valleys due to the HSG polysilicon. Next, as shown in FIG. 2C, the polysilicon is vertically anisotropically etched. The vertical anisotropic etching forms a very irregular top surface 21 due to the hills and valleys of the HSG polysilicon. The vertical anisotropic etching also breaks through the native oxide on the top surface 21 of the first capacitor plates. The resulting irregular top surface 21 increases the surface area of the first capacitor plates and the capacitance of the completed capacitor will be increased. However the sidewalls 20 of the first capacitor plates are smooth and provide no increase in surface area.

Another method used to increase the surface area of capacitor plates is shown in FIGS. 1 and 3A–3C. FIG. 1 shows the layer of first dielectric 12 with contact holes 14 formed on the integrated circuit wafer 10. In this case, as shown in FIG. 3A, the polysilicon layer 16 is patterned before the layer of HSG polysilicon is formed. As shown in FIG. 3B the HSG polysilicon then forms on the sidewalls 20 of the first capacitor plates as well as the top surface 21. As before a thin layer of native oxide 11 is formed on the first capacitor plates between the polysilicon 16 and the HSG polysilicon 18. As shown in FIG. 3C, the polysilicon is then vertically anisotropically etched thereby forming an irregular top surface 21 and removing the HSG polysilicon from the spaces between the first capacitor plates. The native oxide is removed from the top surface 21 of the first capacitor plates however native oxide 11 remains on the sidewalls. During subsequent cleaning and other processing steps individual hemispherical grains 19 can break away from the sidewalls 20 due to the native oxide 11 and can cause shorting between adjacent first capacitor plates causing a yield loss. Residue of the hemispherical grains in the spaces between first capacitor plates can also contribute to shorting between adjacent first capacitor plates and yield loss.

It is a principle objective of this invention to provide a method of using hemispherical grains to achieve increased surface area on the top surface and sidewalls of first capacitor plates without yield loss due to individual grains breaking away or shorting between adjacent first capacitor plates.

This objective is achieved by performing an annealing step after the hemispherical grains have been deposited and a timed vertical anisotropic etch of a part of the first dielectric layer in the spaces between first capacitor plates after the vertical anisotropic etch of the hemispherical grains. During the annealing step the phosphorous used to dope the polysilicon layer breaks through the native oxide and prevents individual grains from becoming detached during cleaning or other processing steps. The timed vertical anisotropic etch of a part of the first dielectric layer in the spaces between first capacitor prevents shorting between adjacent first capacitor plates.

BRIEF DESCRIPTION OF THE DRAWINGS

FIG. 1 shows a cross section view of an integrated circuit wafer after a layer of first dielectric with contact holes has been formed.

FIGS. 2A–2C show cross section views of an integrated circuit wafer for a conventional method of using HSG polysilicon to form first capacitor plates having an irregular top surface and smooth sidewalls.

FIGS. 3A–3C show cross section views of an integrated circuit wafer for a conventional method of using HSG polysilicon to form first capacitor plates having an irregular top surface and HSG polysilicon on the sidewalls.

FIG. 4 shows a cross section view of an integrated circuit wafer having a layer of polysilicon formed over the layer of first dielectric having contact holes.

DESCRIPTION OF THE PREFERRED EMBODIMENTS

Figure 5:
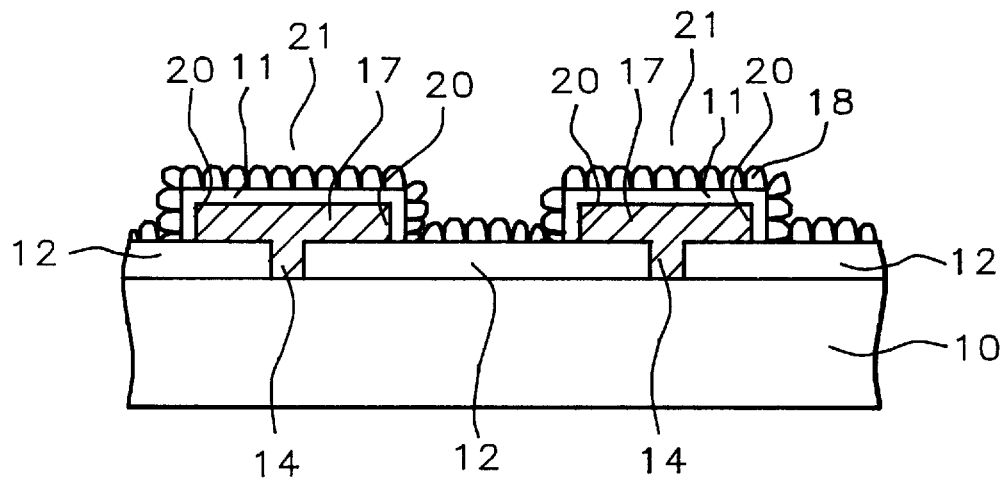
FIG. 5 shows a cross section view of an integrated circuit wafer after the polysilicon layer has been patterned and HSG polysilicon has been deposited.

Refer now to FIGS. 1 and 4–8 for a description of the preferred embodiments of the method of forming capacitor plates of this invention. FIG. 1 shows a substrate 10 with a layer of first dielectric 12 formed on the substrate 10 and contact holes 14 formed in the layer of first dielectric 12. In this example the substrate is a silicon integrated circuit wafer having devices, not shown, formed therein. In this example the first dielectric 12 is an oxide such as silicon dioxide. Next, as shown in FIG. 4, a layer of first conductor material 16 is formed over the layer of first dielectric 12 filling the contact holes 14. The filled contact holes provide a connection to the first capacitor plate which will be formed from the layer of first conductor material 16. In this example the first conductor material 16 is phosphorous doped polysilicon. Next as shown in FIG. 5 the layer of first conductor material is patterned forming first capacitor plates 17 wherein each first capacitor plate 17 has sidewalls 20 and a top surface 21.

Next, as shown in FIG. 5, a layer of polysilicon hemispherical grains 18, HSG polysilicon, is formed over the integrated circuit wafer covering the first capacitor plates 17 and the first dielectric in the spaces between the first capacitor plates. In this example the HSG polysilicon is formed using low pressure chemical vapor deposition, LPCVD, of silane, $SiH_4$, at a temperature of between about 500° and 600° C. and a pressure of between about 0.01 and 0.5 Torr. During the formation of the layer of HSG polysilicon a thin layer of native oxide 11, having a thickness of between about 2 and 20 Angstroms is formed between the capacitor plates 17 and the layer of HSG polysilicon 18.

Figure 6:
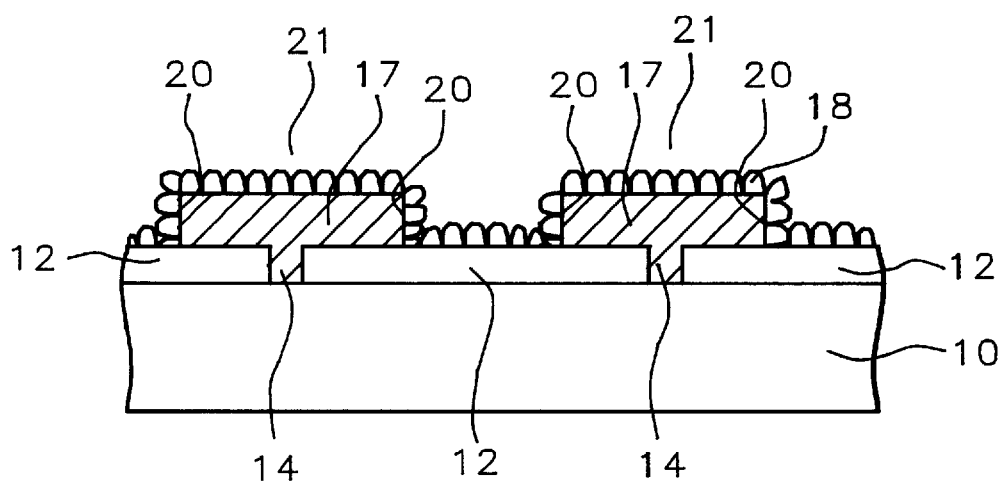
FIG. 6 shows a cross section view of an integrated circuit wafer after the polysilicon layer has been patterned, HSG polysilicon has been deposited, and the wafer has been annealed.

Next, as shown in FIG. 6, the wafer is then annealed at a temperature of between about 700° and 1000° C. for between about 10 and 360 minutes. During this anneal step phosphorous, or other impurities used to dope the polysilicon, breaks through the native oxide and the grains of HSG polysilicon form intimate contact with the phosphorous doped polysilicon or other conductor material forming the first capacitor plates 17. The phosphorous, or other doping impurities, breaking through the native oxide comes from the doped polysilicon layer forming the first capacitor plates. If other conductor materials are used the HSG polysilicon can be doped providing a source of phosphorous. The polysilicon layer forming the first conductor plates and the HSG polysilicon can, for example, be doped with phosphorous or arsenic.

Figure 7:
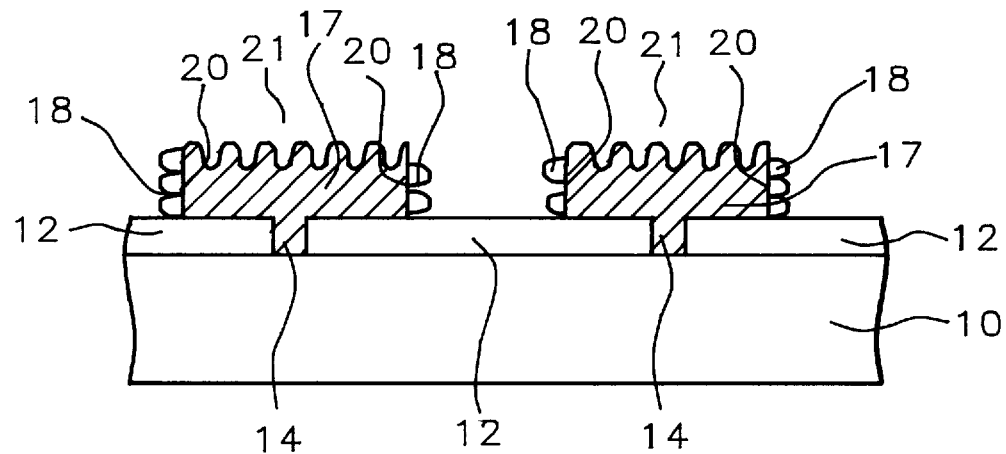
FIG. 7 shows a cross section view of an integrated circuit wafer after the polysilicon layer has been patterned, HSG polysilicon has been deposited, the wafer has been annealed, and the polysilicon has been vertically anisotropically etched.

Next, as shown in FIG. 7, the HSG polysilicon is vertically anisotropically etched using dry etching methods. This etching step removes the HSG polysilicon from the spaces between the capacitor plates and etches into the top surface of the first conductor material of the first capacitor plates forming an irregular surface on the top surface 21 of the first capacitor plates 17. HSG polysilicon 18 remains firmly attached to the sidewalls 20 of the first capacitor plates 17 because of the previous annealing step.

Figure 8:
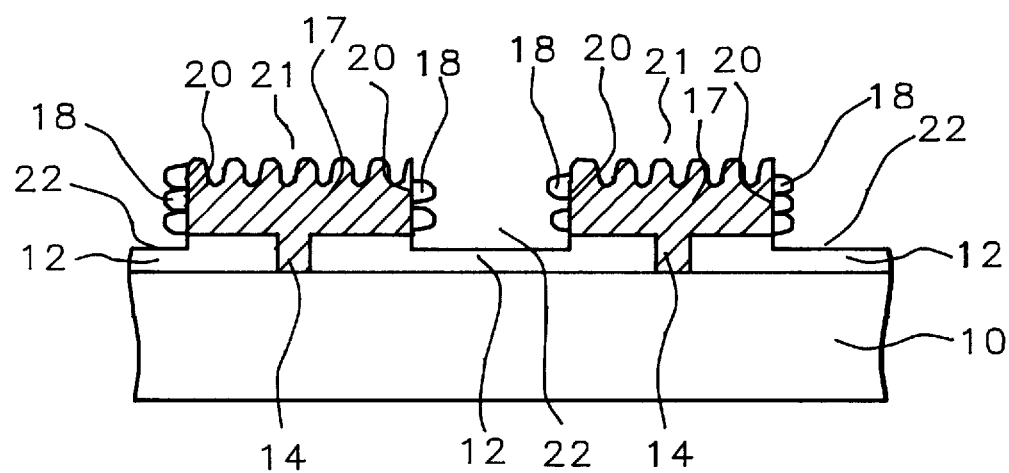
FIG. 8 shows a cross section view of an integrated circuit wafer after the polysilicon layer has been patterned, HSG polysilicon has been deposited, the wafer has been annealed, the polysilicon has been vertically anisotropically etched, and a part of the first dielectric layer has been vertically anisotropically etched thereby completing the first capacitor plates.

Next, as shown in FIG. 8, part of the first dielectric 12 in the spaces 22 between the first capacitor plates 17 is removed using a timed etchback with vertical anisotropic etching using dry etching methods which will not remove polysilicon or other material used for the first capacitor plates. Examples of dry etching methods are described in "Silicon Processing for the VLSI Era, Volume 1-Process Technology," by S. Wolf and R. N. Tauber, Lattice Press, Sunset Beach, Calif., 1986, pages 555–558. The wafer is then cleaned using dilute hydrofluoric acid. Because of the previous annealing step the grains of HSG polysilicon 18 remain firmly attached to the sidewalls of the first capacitor plates 17. The timed etchback step insures that there will no material left between adjacent first capacitor plates 17 which could cause electrical shorting problems. A layer of second dielectric, not shown, is then formed over the top surface 21 and sidewalls 20 of the first capacitor plates 17. Second capacitor plates, not shown, are then formed over the first capacitor plates to complete the capacitors.

While the invention has been particularly shown and described with reference to the preferred embodiments thereof, it will be understood by those skilled in the art that various changes in form and details may be made without departing from the spirit and scope of the invention.

What is claimed is:

1. A method of forming capacitors, comprising the steps of:

providing a substrate;

forming a layer of first dielectric on said substrate;

forming contact holes in said layer of first dielectric;

forming a layer of first conductor material on said layer of first dielectric thereby filling said contact holes in said layer of first dielectric;

patterning said layer of first conductor material thereby forming a number of first capacitor plates, wherein each said first capacitor plate has a top surface and sidewalls, and spaces between said first capacitor plates wherein those portions of said layer of first dielectric in said spaces are exposed;

forming a layer of polysilicon hemispherical grains on said top surface and sidewalls of each said first capacitor plate and said portions of said layer of first dielectric in said spaces between said first capacitor plates;

annealing said substrate after forming said layer of hemispherical grains;

anisotropically etching said layer of hemispherical grains and said first capacitor plates after annealing said substrate thereby forming an irregular top surface on each said first capacitor plate and removing those portions of said layer of hemispherical grains in said spaces between said first capacitor plates;

anisotropically etching said portions of said layer of first dielectric in said spaces between said first capacitor plates using said first capacitor plates as a mask;

cleaning said substrate after anisotropically etching said portions of said layer of first dielectric in said spaces between said first capacitor plates;

forming a second dielectric on said irregular top surface and said sidewalls of each said first capacitor plate; and forming a second capacitor plate over said second dielectric formed on said irregular top surface and said sidewalls of each said first capacitor plate.

2. The method of claim 1 wherein said first conductor material is doped polysilicon.

3. The method of claim 2 wherein said doped polysilicon is polysilicon doped with phosphorous or arsenic.

4. The method of claim 1 wherein said first dielectric is an oxide or silicon nitride.

5. The method of claim 1 wherein said annealing said substrate is carried out at a temperature of between about 700° and 1000° C.

6. The method of claim 1 wherein said polysilicon hemispherical grains are formed by means of low pressure chemical vapor deposition using silane at a temperature of between about 500° and 600° C. and a pressure of between about 0.01 and 0.5 Torr.

7. The method of claim 1 wherein said polysilicon hemispherical grains are formed of phosphorous doped polysilicon or arsenic doped polysilicon.

8. The method of claim 1 wherein cleaning said substrate is accomplished using dilute hydrofluoric acid.

9. The method of claim 1 wherein said anisotropically etching said layer of hemispherical grains consists of vertically anisotropically etching said layer of hemispherical grains.

10. The method of claim 1 wherein said anisotropically etching said portions of said layer of first dielectric in said spaces between said first capacitor plates consists of vertically anisotropically etching said portions of said layer of first dielectric in said spaces between said first capacitor plates.

11. The method of claim 1 wherein said substrate is a silicon integrated circuit wafer having devices formed therein.

12. A method of forming capacitors, comprising the steps of:

providing an integrated circuit wafer having devices formed therein;

forming a layer of first dielectric on said substrate;

forming contact holes in said layer of first dielectric;

forming a layer of doped polysilicon on said layer of first dielectric thereby filling said contact holes in said layer of first dielectric;

patterning said layer of doped polysilicon thereby forming a number of first capacitor plates, wherein each said first capacitor plate has a top surface and sidewalls, and spaces between said first capacitor plates wherein those portions of said layer of first dielectric in said spaces are exposed;

forming a layer of polysilicon hemispherical grains on said top surface and sidewalls of each said first capacitor plate and said portions of said layer of first dielectric in said spaces between said first capacitor plates;

annealing said integrated circuit wafer after forming said layer of polysilicon hemispherical grains;

anisotropically etching said layer of polysilicon hemispherical grains and said capacitor plates after annealing said integrated circuit wafer thereby forming an irregular top surface on each said first capacitor plate and removing those portions of said layer of polysilicon hemispherical grains in said spaces between said first capacitor plates;

anisotropically etching said portions of said layer of first dielectric in said spaces between said first capacitor plates using said first capacitor plates as a mask;

cleaning said integrated circuit wafer after anisotropically etching said portions of said layer of first dielectric in said spaces between said first capacitor plates;

forming a second dielectric on said irregular top surface and said sidewalls of each said first capacitor plate; and forming a second capacitor plate over said second dielectric formed on said irregular top surface and said sidewalls of each said first capacitor plate.

13. The method of claim 12 wherein said first dielectric is an oxide or silicon nitride.

14. The method of claim 12 wherein said annealing said integrated circuit wafer is carried out at a temperature of between about 700° and 1000° C.

15. The method of claim 12 wherein said polysilicon hemispherical grains are formed by means of low pressure chemical vapor deposition using silane at a temperature of between about 500° and 600° C. and a pressure of between about 0.01 and 0.5 Torr.

16. The method of claim 12 wherein cleaning said integrated circuit wafer is accomplished using dilute hydrofluoric acid.

17. The method of claim 12 wherein said doped polysilicon is doped with phosphorous or arsenic.

18. The method of claim 12 wherein said polysilicon hemispherical grains are doped with phosphorous or arsenic.

19. The method of claim 12 wherein said anisotropically etching said layer of polysilicon hemispherical grains consists of vertically anisotropically etching said layer of polysilicon hemispherical grains.

20. The method of claim 12 wherein said anisotropically etching said portions of said layer of first dielectric in said spaces between said first capacitor plates consists of vertically anisotropically etching said portions of said layer of first dielectric in said spaces between said first capacitor plates.

* * * * *